(12) United States Patent
Viefers et al.

(10) Patent No.: US 7,279,760 B2
(45) Date of Patent: Oct. 9, 2007

(54) NANOTUBE RELAY DEVICE

(75) Inventors: Susanne Viefers, Oslo (NO); Tomas Nord, Göteborg (SE); Jari Kinaret, Mölndal (SE)

(73) Assignee: Chalmers Intellectual Property Rights AB (SE)

( * ) Notice: Subject to any disclaimer, the term of this patent is extended or adjusted under 35 U.S.C. 154(b) by 0 days.

(21) Appl. No.: 10/508,288

(22) PCT Filed: May 2, 2002

(86) PCT No.: PCT/SE02/00853

§ 371 (c)(1),
(2), (4) Date: Jun. 27, 2005

(87) PCT Pub. No.: WO03/078305

PCT Pub. Date: Sep. 25, 2003

(65) Prior Publication Data

US 2005/0230710 A1    Oct. 20, 2005

(30) Foreign Application Priority Data

Mar. 20, 2002   (SE)   .................................... 0200868

(51) Int. Cl.
*H01L 29/86*   (2006.01)
(52) U.S. Cl. ............... 257/415; 257/418; 257/E29.167; 438/52; 977/742; 977/940; 200/181
(58) Field of Classification Search ............... 977/742, 977/938, 936, 940, 932; 257/415, 418, E29.167; 438/52; 200/181
See application file for complete search history.

(56) References Cited

U.S. PATENT DOCUMENTS

| 6,756,795 B2 * | 6/2004 | Hunt et al. .................. 324/701 |
| 2002/0130353 A1 * | 9/2002 | Lieber et al. ............... 257/315 |
| 2003/0021966 A1 * | 1/2003 | Segal et al. .................. 428/209 |

FOREIGN PATENT DOCUMENTS

| DE | 100 34 315 A1 | 1/2002 |
| WO | WO-00/52722 | 9/2000 |
| WO | WO-01/61753 A1 | 8/2001 |

OTHER PUBLICATIONS

Dequesnes, et al, Calculation Of Pull-In Voltages For Carbon-Nanotube-Based Nanoelectromechanical Switches, Nanotechnology, Jan. 22, 2002, pp. 120-131, vol. 13, IOP Publishing Ltd. UK.

* cited by examiner

*Primary Examiner*—Bradley Baumeister
*Assistant Examiner*—Steven J. Fulk
(74) *Attorney, Agent, or Firm*—Lerner, David, Littenberg, Krumholz & Mentlink, LLP

(57) ABSTRACT

The present invention relates to a nanotube device (100, 600), comprising a nanotube with a longitudinal and a lateral extension, a structure for supporting at least a first part of the nanotube, and first means for exerting a force upon the nanotube in a first direction defined by its lateral extension. At least a second part of the nanotube protrudes beyond the support of said structure, so that when said force exceeds a certain level, the second part of the nanotube will flex in the direction of its lateral extension, and thereby close a first electrical circuit. Suitably, the first means for exerting said force upon the nanotube is an electrical means, the force being created by applying a voltage to the means.

8 Claims, 3 Drawing Sheets

NANOTUBE RELAY DEVICE

TECHNICAL BACKGROUND

Nanotechnology is a rapidly growing field of technology, including the development of so called nanotubes. Due to the inherently small size of the devices involved in this field of technology, nanotechnology would be ideal for applications within for example the field of electronics, for example within the semiconductor field. Memory devices are one example of an application which would benefit greatly from nanotechnology.

SUMMARY OF THE INVENTION

There is thus a need for a device in the nanoscale size which could serve as a multi-state logical switch or a memory element.

This need is met by the present invention in that it provides a nanotube device comprising a nanotube with a longitudinal and a lateral extension, a structure for supporting at least a first part of the nanotube, and first means for exerting a force upon the nanotube in a first direction defined by its lateral extension. At least a second part of the nanotube protrudes beyond the support of said structure, so that when said force exceeds a certain level, the second part of the nanotube will flex in the direction of its lateral extension, and thereby close a first electrical circuit.

Suitably, the first means for exerting said force upon the nanotube is an electrical means, the force being created by applying a voltage to the means.

BRIEF DESCRIPTION OF THE DRAWINGS

The invention will be described in more detail below, with reference to the appended drawings, in which.

EMBODIMENTS

Figure 1:
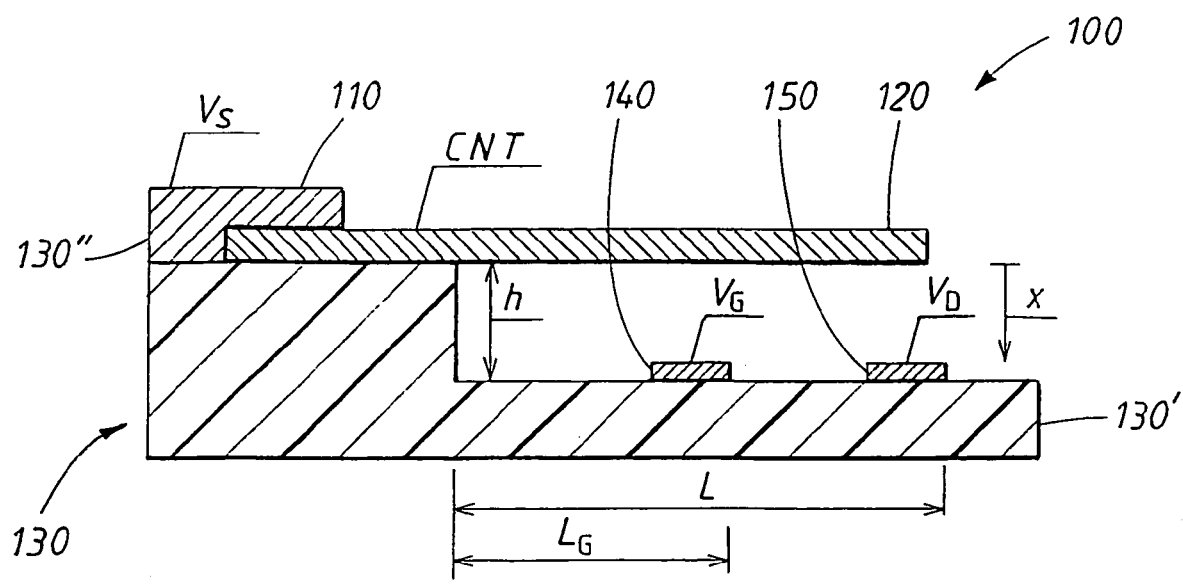
FIG. 1 shows a schematic side view through a device according to the invention.

FIG. 1 shows a first embodiment of a device 100 according to the invention. The device comprises a nanotube 120, preferably a conducting nanotube, suitably a carbon nanotube.

The device further includes a structure 130, made of a non-conducting material such as for example silicon, Si, which supports at least a first portion of the nanotube, with another second portion of the nanotube protruding beyond the supporting structure, and thus being unsupported. The first, supported, portion of the nanotube is connected to an electrode 110, referred to from now on as the source electrode.

The supporting structure 130 is suitably shaped as a terrace, and thus has a "step-like" structure, with an upper level 130", and a lower level 130', where the two levels are interconnected by a wall-like shape of the structure 110. The difference in height between the two levels 130', 130" of the structure as defined by the height of the wall is referred to by the letter h. It should be noted that the use of the word "level" throughout this description refers to a difference in dimensions which gives the structure a preferably step-like form either in the horizontal or in the vertical orientation of the device.

On the lower level 130' of the structure, there are arranged two additional electrodes, one being referred to as the gate electrode 140, and the other as the drain electrode, 150. The gate electrode is located at a distance $L_G$ to the nearest point of the wall, and the corresponding distance for the drain electrode is denoted as $L_D$, where $L_G$ suitably is smaller than $L_D$.

The total extension of the protruding part of the nanotube is preferably within the interval of 50 to 150 nm, suitably of the order of approximately 100 nm, with the height h being approximately in the order of size of 3 nm.

When a voltage is applied to the gate electrode 140, a resulting capacitive force will act on the nanotube 120, in the direction towards the gate electrode, which is thus a direction defined by the lateral extension of the nanotube, in the picture perceived as a "downwards" direction. The force, denoted as Fc, may be described by the mathematical formula seen below:

$$Fc = -(Q_G^2/2)\frac{d}{dx}(1/C_G(x)) - (Q_D^2/2)\frac{d}{dx}(1/C_D(x))$$

In this formula, $Q_G + Q_D$ is the excess charge on the nanotube, $C_G$ and $C_D$ are capacitances which will be explained in more detail below with reference to FIG. 2, and x is the shortest distance between the nanotube 120 and the lower level 130' of the structure.

Figure 2:
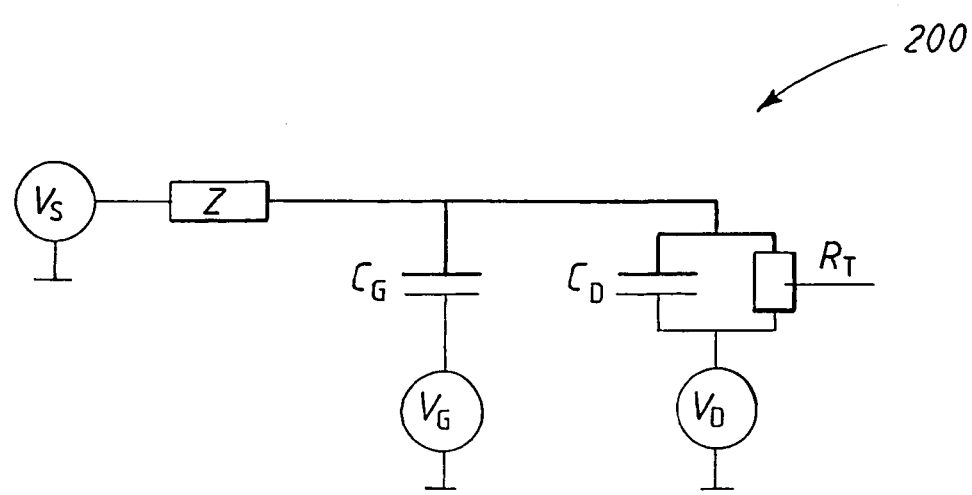
FIG. 2 shows a circuit equivalent to the device of FIG. 1.

FIG. 2 is an equivalent circuit 200 of the device in FIG. 1: The source voltage $V_S$ is connected, via an impedance Z, to the gate voltage $V_G$ through the capacitance $C_G$, and to the drain voltage $V_D$ through the capacitance $C_D$ and a resistance $R_T$, which is connected in parallel to the drain capacitance $C_D$. Due to the mechanical movement caused by the force $F_C$, the capacitances $C_G$ and $C_D$ and the resistance $R_T$ will vary in time.

The resistance $R_T$ can be expressed by the formula seen below:

$$R_T = R_0 e^{((h-x)/\lambda)}$$

$R_0$ is estimated from experimental results, and can be said to be of the order of tens to hundreds of kiloohms, and the tunneling length, $\lambda$, is typically in the order of 0.5 Å. The distance x can, as will be realized, be varied by varying the voltage $V_G$ applied to the gate.

Figure 3:
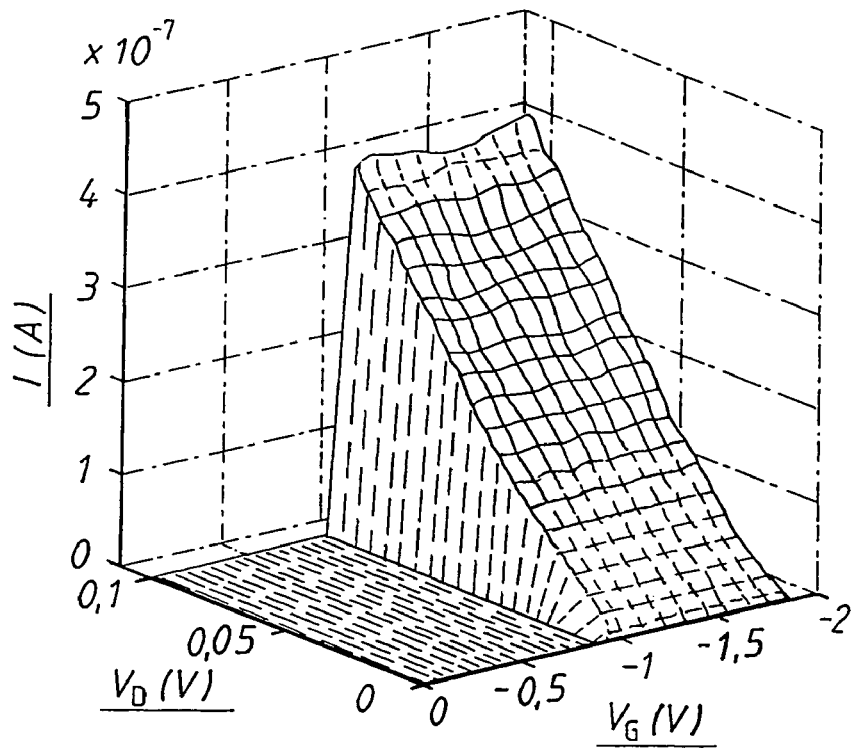
FIG. 3 shows current as a function of voltages in the device of FIG. 1.

FIG. 3 shows the current-voltage function for a typical set of parameters. On one of the horizontal axes, the gate voltage, $V_G$ is shown, and on the other horizontal axis the drain voltage, $V_D$, can be seen, with the vertical axis depicting the current which passes through the source electrode to the drain electrode. As can be seen from this figure, there is a sharp transition from a non-conducting (off) state for the device to a conducting (on) state when the gate voltage is varied, with the source voltage fixed.

Figure 4:
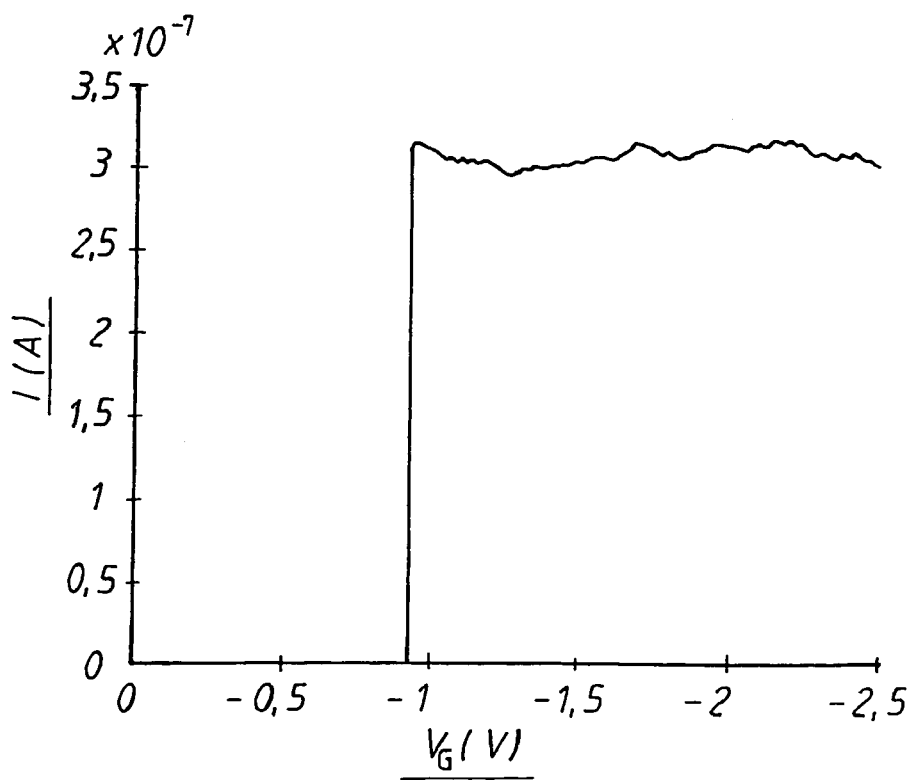
FIG. 4 shows an on-off transition for the current in the device in FIG. 1.

FIG. 4 shows the current-voltage characteristics of the device with the source voltage at a fixed value. The shift in gate voltage required to make a transition from the "off" to the "on" state is approximately 1.5 mV.

The time required to make a transition from the "on"-state to the "off"-state for the device in FIG. 1 is considerably much shorter than the time to make the opposite transition, i.e. from the "off"-state to the "on"-state. Naturally, the switching dynamics of the device according to the invention can be affected by altering the geometry of the device, e.g. the wall height h, the positioning $L_G$, $L_D$ of the electrodes on the lower level 130' of the terrace, and the length of the protruding part L of the nanotube. Thus, by suitable design, the device according to the present invention can be applied to meet the demands of different applications.

Figure 5:
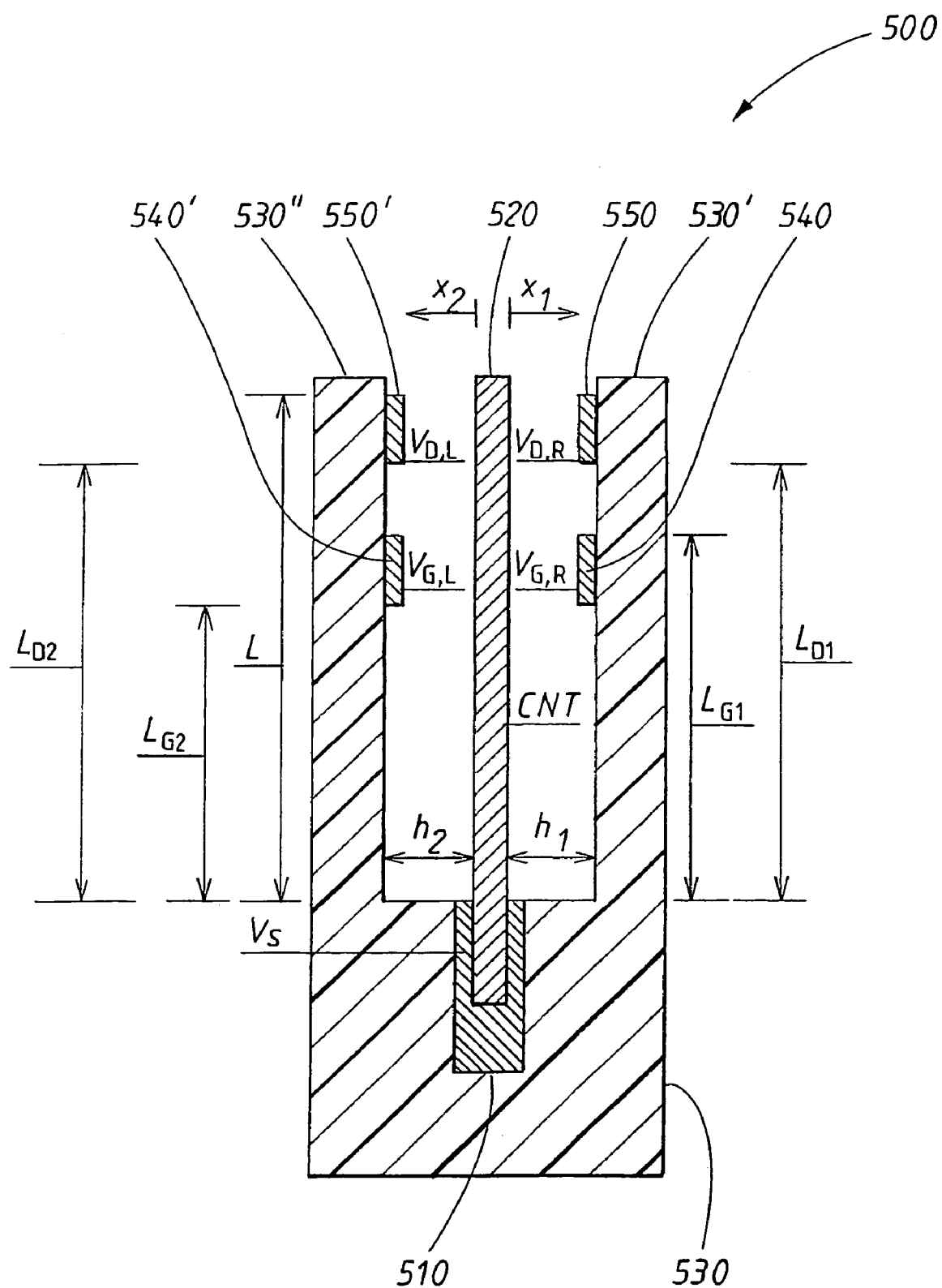
FIG. 5 shows a top view of an alternative embodiment of the invention.

FIG. 5 shows a top view of another embodiment 500 of the invention. This embodiment 500 comprises a nanotube device similar to that shown in FIG. 1 and described above, but with the supporting terraced structure 530 additionally comprising a structure 530" on a third level, said third level 530" being located essentially in parallel with the second level 530', but on an opposite side of the protruding part of the nanotube 520.

The embodiment 500 comprises essentially all of the features of the device in FIG. 1, and additionally comprises second means 540' for exerting a force upon the nanotube 520 in a second direction defined by its lateral extension, so that when said force exceeds a certain level, the second part of the nanotube will flex in the second direction of its lateral extension, and thereby close a second electrical circuit. Said second direction is, as will be realized from FIG. 5, the direction which is towards the means 540'. When force is exerted upon the nanotube 520 via the means 540', which is preferably a second gate electrode, the second, protruding, part of the nanotube 520 will flex in the second direction of its lateral extension, and thereby close a second electrical circuit. This second electrical circuit is suitably defined by the source electrode 510 described in connection with FIG. 1, and a second drain electrode 550' located on the third level 530" of the supporting structure 530.

The second gate and drain electrodes are located at distances $L_{G2}$ and $L_{D2}$ respectively from the wall of the terraced structure.

Although the invention has been described with reference to examples of certain embodiments, the invention may be varied within the scope of the appended claims.

The invention claimed is:

1. A nanotube device, comprising a nanotube having a longitudinal extension extending in a longitudinal direction of said nanotube and a lateral extension extending in a lateral direction transverse to the longitudinal direction, said nanotube including a first part extending in the longitudinal direction, a second part connected to said first part and extending in the longitudinal direction, said second part having a free end spaced a distance from said first part, the nanotube device further including a structure extending at least substantially in the longitudinal direction at least generally parallel to said first part of said nanotube to support said first part of said nanotube, and first means operable to exert a force upon said second part in a first direction defined by the lateral extension, characterized in that said second part of said nanotube protrudes in the longitudinal direction beyond said structure such that said free end is unsupported, and when the force exceeds a predetermined level, said second part of said nanotube is subject to flex in a the first direction to thereby close a first electrical circuit.

2. A nanotube device according to claim 1, characterized in that said first means includes an electrical means, said electrical means being operable upon application of a voltage to exert the force.

3. A nanotube device according to claim 1, in which said structure includes a first structure at a first level of a multiple-level terraced structure, said multi-level terraced structure further including a second structure at a second level above or below the first level, said first part of said nanotube being supported by said first structure, and said first means being supported by said second structure.

4. A nanotube device according to claim 3, in which said first means includes a first gate electrode, and the first circuit includes a first drain electrode supported by said second structure and a first source electrode supported by said first structure.

5. A nanotube device according to any of claims 3 or 4, in which said multi-level terraced structure additionally includes a third structure on a third level of said terraced structure, said third structure having a longitudinal extension oriented parallel to a longitudinal extension of said second structure, and said third structure being disposed on an opposite side of said second part from said second structure, the nanotube device further comprising a second means operable to exert a second force upon said nanotube in a second direction defined by the lateral extension, the second direction being different from the first direction, so that when the force exceeds a second predetermined level in the second direction, said second part of said nanotube is subject to flex in the second direction to thereby close a second electrical circuit.

6. A nanotube device according to claim 5, characterized in that said second means includes an electrical means, said electrical means being operable upon application of a voltage to exert the force.

7. A nanotube device according to claim 5, in which said second means includes a second gate electrode, and the second circuit includes a second drain electrode supported by said third structure.

8. A nanotube device according to claim 2, in which said structure includes a multiple-level terraced structure having a first structure at a first level and a second structure at a second level, said first part of said nanotube being supported by said first structure, and said first means being supported by said second structure.

\* \* \* \* \*

UNITED STATES PATENT AND TRADEMARK OFFICE
CERTIFICATE OF CORRECTION

| | |
|---|---|
| PATENT NO. | : 7,279,760 B2 |
| APPLICATION NO. | : 10/508288 |
| DATED | : October 9, 2007 |
| INVENTOR(S) | : Susanne Viefers, Tomas Nord and Jari Kinaret |

It is certified that error appears in the above-identified patent and that said Letters Patent is hereby corrected as shown below:

On the title page item (75), "Oslo (NO)" should read --Göteborg (SE)--
On the title page item (74), "Mentlink" should read --Mentlik--
Column 4, line 5, "in a the" should read --in the--

Signed and Sealed this

Twenty-third Day of September, 2008

JON W. DUDAS
*Director of the United States Patent and Trademark Office*